(12) United States Patent
Mens

(10) Patent No.: US 7,301,340 B2
(45) Date of Patent: Nov. 27, 2007

(54) MAGNETIC RESONANCE IMAGING WITH HISTOGRAM-BASED PHASE CORRECTION

(75) Inventor: Wilhelmus Reinerius Maria Mens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/553,327

(22) PCT Filed: Apr. 5, 2004

(86) PCT No.: PCT/IB2004/050394

§ 371 (c)(1),
(2), (4) Date: Oct. 14, 2005

(87) PCT Pub. No.: WO2004/090565

PCT Pub. Date: Oct. 21, 2004

(65) Prior Publication Data

US 2006/0197525 A1   Sep. 7, 2006

(30) Foreign Application Priority Data

Apr. 14, 2003   (EP) ................... 03100997

(51) Int. Cl.
*G01V 3/00* (2006.01)
(52) U.S. Cl. .................................... 324/307
(58) Field of Classification Search ........ 324/300–322; 600/410–435; 382/128–134, 154, 168–180, 382/254–275, 280; 702/7, 19, 85–107
See application file for complete search history.

(56) References Cited

U.S. PATENT DOCUMENTS

| | | | |
|---|---|---|---|
| 4,760,339 A | 7/1988 | Yamamoto et al. | |
| 6,249,595 B1 * | 6/2001 | Foxall et al. | 382/128 |
| 6,307,369 B1 * | 10/2001 | Felmlee et al. | 324/309 |
| 6,411,089 B1 * | 6/2002 | Anand et al. | 324/309 |
| 6,486,667 B1 * | 11/2002 | Wu et al. | 324/306 |
| 6,515,476 B1 * | 2/2003 | Oshio et al. | 324/309 |
| 6,597,172 B2 * | 7/2003 | Miyoshi | 324/307 |
| 6,841,997 B2 * | 1/2005 | Feiweier | 324/307 |
| 7,068,031 B2 * | 6/2006 | Miyoshi | 324/307 |

FOREIGN PATENT DOCUMENTS

EP   1 063 532 A2   12/2000

OTHER PUBLICATIONS

Ahn, C.B., et al.; A New Phase Correction Method in NMR Imaging Based on Autocorrelation and Histogram Analysis; 1987; IEEE; MI-6(1)32-36.
Foxall, D.L., et al.; Rapid Iterative Reconstruction for Echo Planar Imaging; 1999; MRM; 42-541-547.
Liu, J., et al.; An Automatic Phase Correction Method in Nuclear Magnetic Resonance Imaging; 1990; J. of Magnetic Resonance; 86:593-604.

* cited by examiner

*Primary Examiner*—Brij Shrivastav
*Assistant Examiner*—Dixomara Vargas

(57) ABSTRACT

A magnetic resonance imaging system comprises reconstruction unit that is arranged to reconstruct a complex image of complex valued pixels from magnetic resonance signals. A compute a distribution of phase values of the complex image and to apply a phase correction to the complex image to form a corrected magnetic resonance image. The phase correction is controlled on the basis of the distribution of phase values of the complex image. Notably, the histogram power function is an effective indicator of the accuracy of the phase correction.

13 Claims, 2 Drawing Sheets

MAGNETIC RESONANCE IMAGING WITH HISTOGRAM-BASED PHASE CORRECTION

Figure 1:
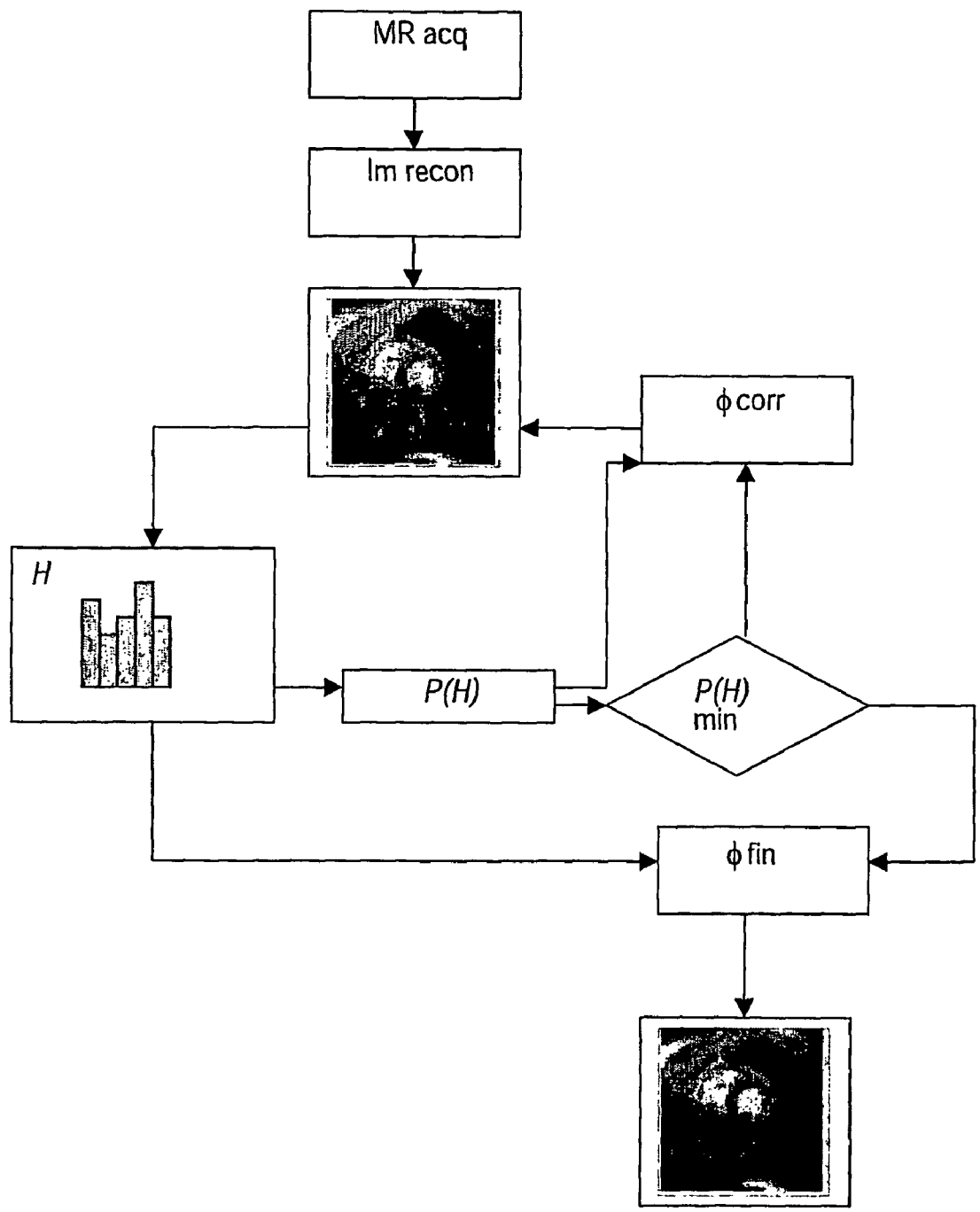

The invention pertains to a magnetic resonance imaging system which involves correction of phase values of the magnetic resonance image.

Magnetic resonance imaging with phase correction is known from the paper '*A new phase correction method in NMR imaging based on autocorrelation and histogram analysis*' by C. B. Ahn and Z. H. Cho in IEEE Trans.MI 6(1987)32-36.

The known magnetic resonance imaging proposes to correct the phase of the complex valued pixels by first making an estimate of the first order phase error. This first order phase error is the contribution to the phase error in a complex valued pixel that is linearly dependent on the position of the pixel in the complex image. This first order phase error is calculated from the autocorrelation between adjacent pixels. On the basis of the estimate of the first order phase error a first-order phase error corrected image is derived. A histogram of phase values of the first-order phase error corrected image is formed. From the location of one peak in this histogram or of peaks being separated by 180° in this histogram, the zero-order phase error is estimated. This zero-order phase error is the overall contribution that is independent of the position of the position of the pixel in the complex image.

An object of the invention is to provided an magnetic resonance imaging method in which phase errors having a complicated nature are corrected more accurately.

This object is achieved by a magnetic resonance imaging method according to the invention comprising a reconstruction unit arranged to reconstruct a complex image of complex valued pixels from magnetic resonance signals compute a distribution of phase values of the complex image apply a phase correction to the complex image to form a corrected magnetic resonance image and control the phase correction on the basis of the distribution of phase values of the complex image.

According to the invention the phase correction is controlled on the basis of the distribution of the phase values of the complex image. It appears that the distribution of phase values is quite sensitive for the way the phase error depends on the position in the complex valued image. Consequently, the distribution of phase values is an accurate indicator for the kind of phase corrections to be effective and also for the accuracy of the result achieved by the phase correction actually applied. These and other aspects of the invention will be further elaborated with reference to the embodiments defined in the dependent claims.

Preferably, the distribution of phase values in the complex image is represented by a histogram of phase values. Generation of the histogram from the complex values of the pixels of the complex image requires very low computational effort and takes only a small memory capacity. Further, the features of the histogram appear to be very sensitive to the way the phase error varies over the complex valued image. Moreover, the features of the histogram also accurately indicate the accuracy achieved in correction of the phase error.

The use of test functions applied to the histogram enhances the sensitivity for particular patterns of variation of the phase error over the complex valued image. Further, the test function provides an easy indication of the accuracy of the correction in terms of a simple real valued number. Particularly suitable test functions are chosen from the class of functions $f$ that satisfy: $f(h) \geq h$ ($h \geq 1$). These test functions enhance peaks in the histograms relative to broader structures. Accurate correction of the phase errors leads to peaks in the histogram and removes broad structures. As the test functions of this aspect of the invention favour peaks in the histogram, these test fixations provide an accurate indication of the accuracy of the correction of the phase errors. Particularly good results are obtained when the histogram power function is employed as the test function. The histogram power function is defined as $$P(H) = \sum_{j \in H} h_j^2.$$

Here H denotes the histogram and $h_j$ is the number of phase-values in the j-th bin of the histogram H. The histogram power function strongly emphasises histograms having a few strong peaks and returns low values for histograms having mainly broad features. Thus the histogram power function provides an effective test which indicates if the phase correction is accurate.

In a further implementation of the invention polynomial phase corrections are carried-out. Such polynomial phase corrections require low computational effort and require only a short computation time. Accordingly, several polynomial phase corrections can be tried within a short time and for the respective phase corrections the histogram is constructed and the histogram power function is computed. Then, the most effective correction is selected on the basis of the minimum histogram power function value. The respective polynomial phase corrections are easily effected just by adapting the polynomial coefficients of the polynomial phase corrections and re-iterating the phase correction with the adjusted polynomial coefficients. Preferably, the polynomial coefficients are adjusted so as to optimise the value of the test function of the histogram. These polynomial coefficients for which the test function of the histogram acquires its optimum value correspond to the most effective polynomial phase correction.

The computational efficiency of the phase correction is further improved in that the phase correction is adjusted by resetting the polynomial coefficients on the basis of a trial and improve algorithm so arrive at a set of polynomial coefficients that correspond to a phase distribution of which the test function of the histogram has it optimum value, notably the histogram power function, is minimum.

The corrected magnetic resonance image is practically void of artefacts caused by phase errors in the magnetic resonance signals. Accordingly, the corrected magnetic resonance image has a high diagnostic value in that the anatomy of the patient to be examined is imaged faithfully, even for small details with low contrast or low contrast-resolution.

The invention also relates to a magnetic resonance imaging method as defined in claim 10. The magnetic resonance imaging method of the invention achieves accurate correction of phase errors in the complex valued image. The invention further relates to a computer programme as defined in claim 11. The computer programme of the invention can be loaded into the reconstruction unit of the magnetic resonance imaging system. Accordingly the reconstruction unit is able to perform accurate correction of phase errors in the complex valued image that is reconstructed from the magnetic resonance signals generated by the magnetic resonance imaging system.

Figure 2:
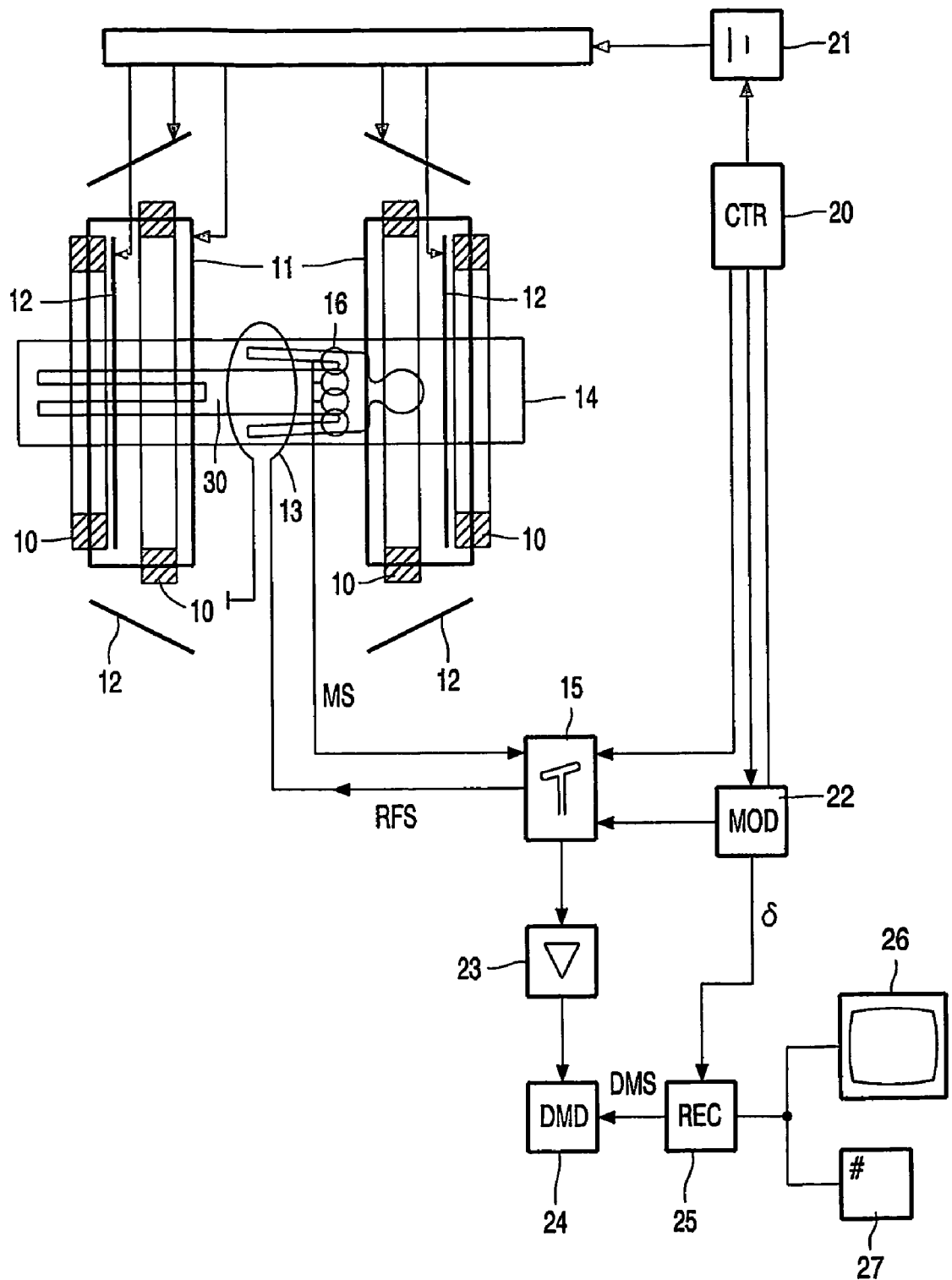

These and other aspects of the invention will be elucidated with reference to the embodiments described hereinafter and with reference to the accompanying drawing wherein FIG. 1 shows a flow chart of an implementation of the method of the invention and FIG. 2 shows a schematic representation of a magnetic resonance imaging system in which the invention is employed.

FIG. 1 shows a flow chart of an implementation of the method of the invention. The magnetic resonance imaging method of the invention involves acquisition (mr-acq) of magnetic resonance signals. From the acquired magnetic resonance signals, the complex image is reconstructed (Im-recon). For individual complex valued pixels of the complex image, the phase is computed. Then the phase-values for the pixels are binned into th histogram. That is, phase-values in pre-determined phase-intervals, the bins, are counted and the numbers of phase values in respective bins form the histogram H. From the histogram the histogram power function $$P(H) = \sum_{j \in H} h_j^2$$

is computed and on the basis of the value of the histogram power function a polynomial phase correction is selected and applied to the complex image. In an iterative way, again the histogram and its histogram power function are computed and a new polynomial phase correction is selected and applied to the current complex image. The iteration is ended when the histogram power function has its minimum value which indicates that the histogram contains a few strong peaks which indicates that the current phase correction is adequate. Optionally, a final phase correction can be performed on the basis of the histogram having the minimum histogram power function value. For example, the optional final phase correction may involve an accurate water-fat shift correction. This water-fat shift correction is based on the separation of two main peaks in the histogram.

FIG. 2 shows a schematic representation of a magnetic resonance imaging system in which the invention is employed. The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energised by application of an electric current by means of the power supply unit 21. The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving coils 16. For example, surface coils 16 can be used as receiving coils. Such surface coils have a high sensitivity in a comparatively small volume. The transmission coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The reconstruction unit of the magnetic resonance imaging system according to the invention is also provided with a processing unit, for example in the form of a computer which includes a (micro)processor. The processing unit of the reconstruction unit is arranged to carry out the phase correction to the complex valued image on the basis of the distribution of phase values in the complex valued image, e.g. as represented by the histogram To this end, the computer program according to the invention is loaded, for example, into the processing unit of the reconstruction unit 25.

The invention claimed is:

1. A magnetic resonance imaging system comprising a reconstruction unit arranged to reconstruct a complex image of complex valued pixels from magnetic resonance signals, compute a distribution of phase values of the complex image, apply a phase correction to the complex image to form a corrected complex image, and iteratively adjust the phase correction on the basis of the distribution of phase values of the complex image.

2. A magnetic resonance imaging system as claimed in claim 1, wherein the distribution of phase values of the complex image is represented by a histogram of the phase values of the complex image.

3. A magnetic resonance imaging system as claimed in claim 2, wherein the phase correction is iteratively adjusted on the basis of a test function of the histogram.

4. A magnetic resonance imaging system as claimed in claim 3 wherein the test function of the histogram discriminates peaks in the histogram from broader distributions.

5. A magnetic resonance imaging system as claimed in claim 4, wherein the test function is formed by the histogram power function.

6. A magnetic resonance imaging system as claimed in claim 3, wherein the reconstruction unit is arranged to make the phase correction on the basis of a polynomial phase correction and to adjust the phase correction by adjusting polynomial coefficients of the polynomial phase correction by way of a trial and improve algorithm controlled to optimize the test function.

7. A magnetic resonance imaging system comprising a reconstruction unit arranged to reconstruct a complex image of complex valued pixels from magnetic resonance signals, compute a distribution of phase values of the complex image represented by a histogram of the phase values of the complex image, apply a phase correction to the complex image controlled on the basis of a test function of the histogram to form a corrected complex image, and control the phase correction on the basis of the distribution of phase values of the complex image by adjusting polynomial coefficients of a polynomial phase correction so as to optimize the test function, the polynomial coefficients being adjusted by way of a trial and improve algorithm controlled on the basis of the test function.

8. A magnetic resonance imaging method comprising:
reconstructing a complex image of complex valued pixels from magnetic resonance signals;
computing a distribution of phase values of the complex image;
applying a phase correction to the complex image to form a corrected complex image;
iteratively adjusting the phase correction on the basis of the distribution of phase values of the complex image to generate an iteratively adjusted phase correction that enhances peaks in the distribution of phase values relative to broader structures; and
displaying or storing an image corresponding to the complex image incorporating the iteratively adjusted phase correction.

9. A magnetic resonance imaging method as claimed in claim 8, wherein:
the applying of a phase correction includes applying a plurality of different phase corrections to the complex image to form a plurality of different trial corrected complex images; and
the iteratively adjusting of the phase correction includes selecting that trial corrected complex image for which the distribution of phase values is optimized.

10. A digital image processing unit including a processing unit programmed to compute a distribution of phase values of a complex image, apply a phase correction to the complex image to form a corrected complex image, and iteratively adjust the phase correction on the basis of a test function of the distribution of phase values of the complex image that discriminates whether the distribution is predominated by peaks or by broader structures, the iterative adjustment being ended when the test function indicates that the distribution is dominated by peaks indicative that the adjusted phase correction is adequate.

11. A digital image processing unit as claimed in claim 10, wherein the test function is a histogram power function.

12. A digital image processing unit as claimed in claim 10, wherein the test function is selected from the group of test functions $f$ that satisfy the condition $f(h)$ is greater than or equal to h for all h greater than or equal to one.

13. A magnetic resonance imaging system comprising a reconstruction unit arranged to
reconstruct a complex image of complex valued pixels from magnetic resonance signals,
compute a distribution of phase values of the complex image,
apply a polynomial phase correction to the complex image to form a corrected complex image, said polynomial phase correction being represented by its polynomial coefficients, and
control the polynomial phase correction on the basis of the distribution of phase values of the complex image by iteratively adjusting polynomial coefficients of the polynomial phase correction.

* * * * *